(12) United States Patent (10) Patent No.: US 7,486,003 B1
Jang (45) Date of Patent: Feb. 3, 2009

(54) POLYMER BULK ACOUSTIC RESONATOR

(76) Inventor: Sei-Joo Jang, Dongbu Haeoreum, Apt 101-1109, 716 Yoksam-Dong, Kangnam-Ku, Seoul (KR)

( * ) Notice: Subject to any disclaimer, the term of this patent is extended or adjusted under 35 U.S.C. 154(b) by 337 days.

(21) Appl. No.: 11/162,775

(22) Filed: Sep. 22, 2005

(51) Int. Cl.
*H03H 9/02* (2006.01)

(52) U.S. Cl. ............... 310/320; 310/800; 333/187; 333/188; 333/189

(58) Field of Classification Search .......... 310/320, 310/800; 333/186–189, 193
See application file for complete search history.

(56) References Cited

U.S. PATENT DOCUMENTS

| | | | |
|---|---|---|---|
| 5,160,870 A * | 11/1992 | Carson et al. ............. | 310/339 |
| 6,182,619 B1 * | 2/2001 | Spitzer et al. ............ | 123/51 B |
| 6,839,946 B2 * | 1/2005 | Ylilammi et al. ........... | 29/25.35 |
| 6,911,708 B2 * | 6/2005 | Park ........................ | 257/416 |
| 7,253,703 B2 * | 8/2007 | Song et al. ................ | 333/133 |
| 2001/0017504 A1 * | 8/2001 | Aigner et al. ............. | 310/330 |
| 2002/0140318 A1 * | 10/2002 | Takeuchi et al. ........... | 310/320 |
| 2005/0128027 A1 * | 6/2005 | Song et al. ................ | 333/133 |
| 2006/0164186 A1 * | 7/2006 | Stoemmer et al. .......... | 333/189 |
| 2006/0202779 A1 * | 9/2006 | Fazzio et al. .............. | 333/187 |

FOREIGN PATENT DOCUMENTS

WO WO/98/16957 * 4/1998

* cited by examiner

*Primary Examiner*—Thomas M Dougherty
(74) *Attorney, Agent, or Firm*—John J. Elnitski, Jr.

(57) ABSTRACT

A polymer bulk acoustic resonator that includes an active semiconductor layer, a first thin film electrode layer applied to the semiconductor layer, a thin film electro-active polymer layer applied to the first thin film electrode layer; and a second thin film electrode layer applied to the thin film electro-active polymer layer.

7 Claims, 8 Drawing Sheets

POLYMER BULK ACOUSTIC RESONATOR

BACKGROUND

The dielectric filter and Surface Acoustic Wave (SAW) filter are used in current wireless mobile telecommunication networks, including phones typically referred to as cell phones. Recently, a new filter system of film bulk acoustic resonator has been introduced. A thin film of piezoelectric material of ZnO is deposited on a substrate of semiconductor made of Si material, by using sputtering methods and Magnetron Sputtering Equipment. The sputtering methods require the use of a Magnetron and are a relatively expensive technique. Also, in order to make an improve efficiency of energy coupling using a film bulk acoustic resonator, a Bragg Reflector is necessary between the ZnO layer and Si Substrate. The Bragg Reflector is usually made by depositing about seven to eight layers alternatively of a very heavy material such as Tungsten with the not so heavy layers of SiO2. This is necessary to prevent acoustic energy resonating loss from inside the piezoelectric thin film of ZnO. The acoustic energy resonating dissipates or leaks out because the magnitudes of two acoustic impedances of ZnO and Si are similar in order. Tungsten has an acoustic impedance of 10.1×10(7) Kg/m(2) s. SiO2 has an acoustic impedance of 1.31×10(7) Kg/m(2) s, which is about 1/10 of that of Tungsten. The mismatch between two acoustic impedances of Tungsten and SiO2 in the Bragg Reflector isolates acoustically the active piezoelectric ZnO layer from the Si substrate. All depositions of layers for the film bulk acoustic resonator are done by using the Magnetron. The film bulk acoustic resonator has potential to be co-processed with active materials of semi-conductors such as Si or SiGe or GaAs. But, the use of film bulk acoustic resonator has a few difficulties to overcome and can be a quite expensive process to manufacture. Also, resonant frequency is function of the thickness of ZnO in a film bulk acoustic resonator, therefore, uniformity of the ZnO thin film thickness is very important. It takes great care and expense to obtain a uniform thin film of ZnO in the order 1/10 of 1 um.

SUMMARY OF THE INVENTION

A polymer bulk acoustic resonator that includes an active semiconductor layer, a first thin film electrode layer applied to the semiconductor layer, a thin film electro-active polymer layer applied to the first thin film electrode layer; and a second thin film electrode layer applied to the thin film electro-active polymer layer.

DETAILED DESCRIPTION OF THE INVENTION

Figure 1:
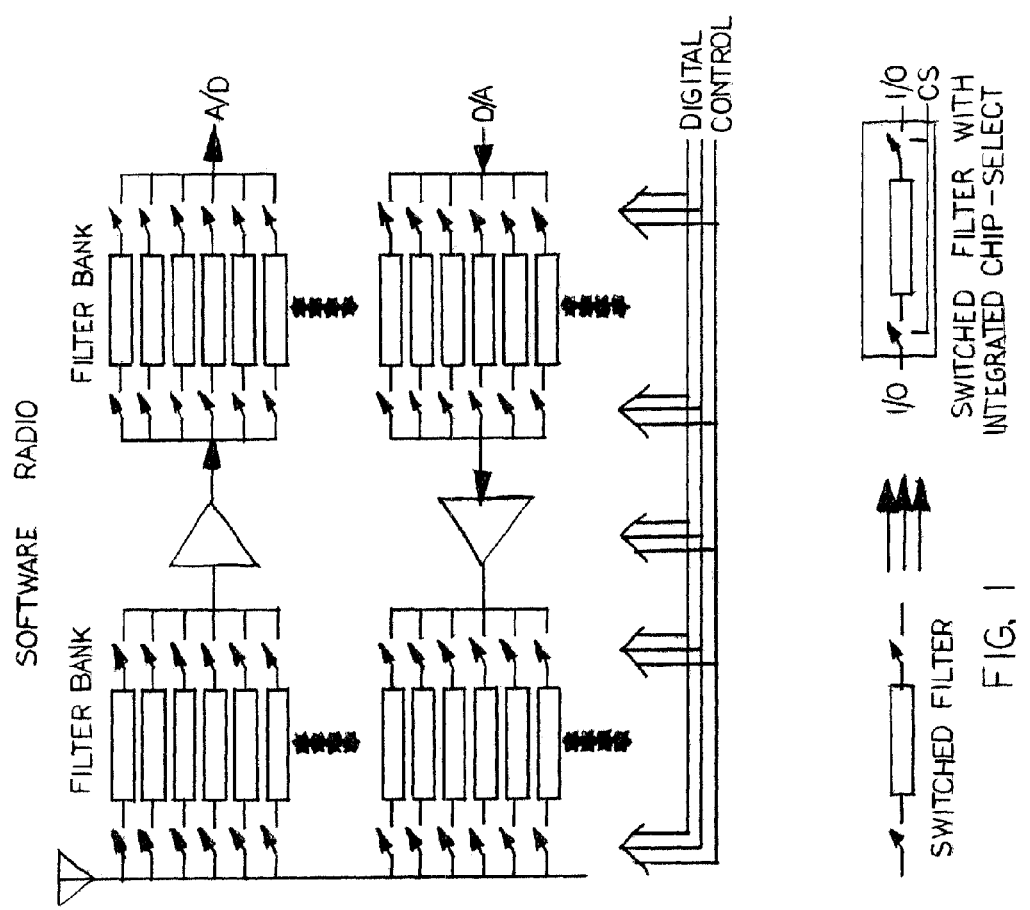
FIG. 1 is a schematic view of circuit module according to the present invention.

Integration between active components of semiconductors such as Silicon (Si), Silicon Germanium (SiGe), bipolar transistors, hetero-junction bipolar transistors (HBTs), and high electron mobility transistors (HEMTs), and Gallium Arsenide (GaAs) field effect transistors, with passive components such as high frequency filter elements, has been desired for sometime. This is because of the desire to have future appliances controlled by one control unit for home and personal electronic equipment at anytime and anyplace, while including for communication capabilities and receiving broadcasts. FIG. 1 shows a block schematic diagram of a circuit module including a filter bank with control switches and amplifiers for use in wireless mobile telecommunication equipment. Both the amplifiers and switches can be included as part of an active component semiconductor materials, such as Si, SiGe or GaAs, and the filter banks are made of dielectric materials. The active component semiconductor materials are used as signal processors which receive a frequency signal and respond to that signal with a desired action. It is desired to have the dielectric materials which are used for the high frequency filters be co-processed with the semiconductor materials to effectively integrated both into a monolithic module for wireless mobile telecommunication equipment. Integration of the dielectric and semiconductor materials into one functioning unit will increase efficiency, reduce manufacturing cost and reduce space require in electronic equipment, as compared to having separate components used today.

The present invention is a polymer bulk acoustic resonator manufactured to integrate the high frequency filters with the semiconductor materials for switches and amplifiers, as described above and shown in FIGS. 2-8. The polymer bulk acoustic resonator utilizes piezoelectric Electro-Active Polymers (EAP) as the thin film materials for manufacturing the polymer bulk acoustic resonator. The manufacture of the polymer bulk acoustic resonator employs a new approach in order to co-process active semiconductor materials such as Si, SiGe or GaAs with passive high frequency filter piezoelectric polymer materials of EAP. By using EAP materials for passive filter devices, one can readily and cost effectively produce integrated modules of a passive filter bank along with active switches and amplifiers for wireless mobile telecommunication network equipment. The operating frequency of the polymer bulk acoustic resonator depends primarily on the thickness, density and bulk modulus of the EAP materials, which can be in the range of about 100 MHz to 30 GHz. The sound velocity (v) for EAP materials ranges from fifteen-hundred (1500) to two-thousand (2000) meters per second. For a given resonant frequency $f_R$, there is the equation $f_R = v/(2*(\text{thickness of the EAP}))$. Therefore, the thickness of EAP films for 1 GHz, 3 GHz, and 10 GHz resonant frequencies are 0.75 um, 0.25 um, and 0.075 um, respectively. Usually, it is desired for the polymer bulk acoustic resonator to allow passage of the quarter wavelength resonate of the desired frequency or frequencies.

Photolithography methods and spin casting techniques are used for semiconductor fabrication and can be used to fabricate the polymer bulk acoustic resonator. Photolithography methods are used for cleaning the semiconductor to receive other layers. Spin casting is used to apply layers of other materials to the semiconductor. Metals such as Aluminum (Al), Gold (Au), Platinum (Pt) and conductive polymer materials such as poly-acetylene, polypyrrole, poly-aniline, polythiophene, and other high molecular polymers can all be used as electrode materials in a liquid phase for the manufacture of the polymer bulk acoustic resonator. Electrodes and piezoelectric polymer thin film layers formed on semiconductor substrates can be made by the spin casting the material on the semiconductor. The spin casted materials are then cured by solidifying thermally or by exposing the material to light energy sources of ultra-violet light. The photolithograph method can be used with masking techniques and organic cleaning during manufacture of the polymer bulk acoustic resonator to prepare the surface of the semiconductor and other layers to receive the next layer. The spin casting technique scan be used to make both piezoelectric EAP layers and electrode layers during the manufacturing of the polymer bulk acoustic resonator. Note, that both EAP and electrode materials are available as liquid phases for use with spin casting techniques. By using the EAP as materials for the piezoelectric bulk acoustic resonator, the Bragg Reflector which is integrated in the film bulk acoustic resonator for use in the active semiconductor based switch and amplifier circuits can be eliminated. This is because the magnitudes of the acoustic impedance of the EAP material is not similar to the semiconductor substrate material. The evaporating of piezopolymer and electrode layers by thermal or laser techniques can also be used to form the desired thin layers of EAP, which can be co-processed with the active control elements of switches and amplifiers on semiconductor substrates. The thickness of spin casting the EAP and electrodes layers can be controlled readily to provide the required uniformity at less cost then using the Magnetron method.

Figure 2:
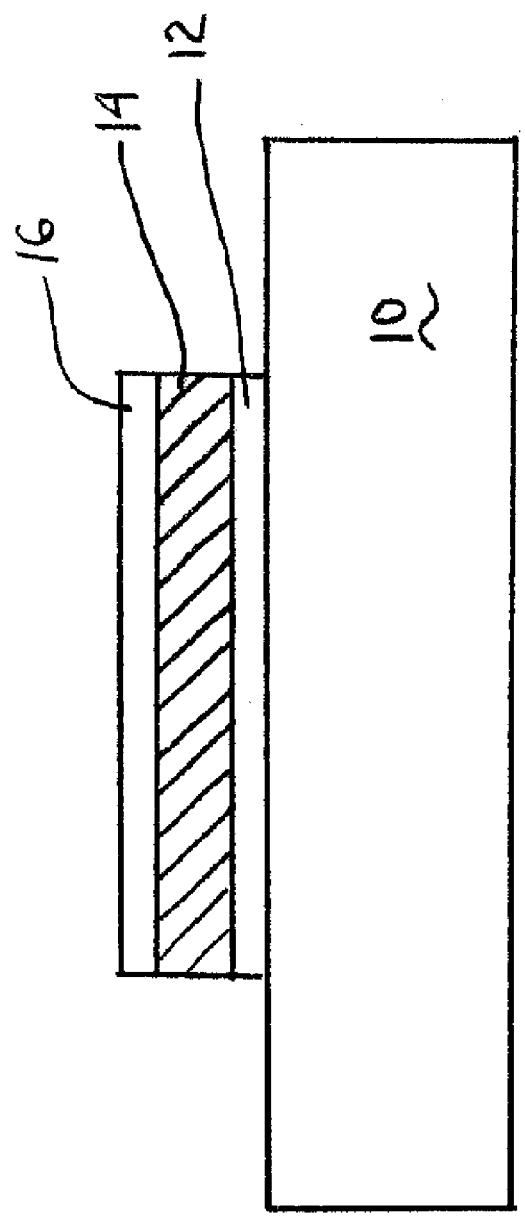
FIG. 2 is a schematic view of polymer bulk acoustic resonator according to the present invention.

FIGS. 2-8 schematically show on the processing steps of one method of manufacturing the polymer bulk acoustic resonator. FIG. 2 shows a schematic diagram of a polymer bulk acoustic resonator. FIG. 1 shows the semiconductor substrate layer 10 with a thin film bottom electrode layer 12 stacked on top of the semiconductor substrate layer. A thin film EAP layer 14 is stacked on top of the thin film bottom electrode layer 12. A thin film top electrode layer 16 is stacked on top of the thin film EAP layer 14. Note, there is no air gap or Bragg Reflector required to minimize the acoustic energy loss from the EAP layer to semiconductor substrate layer. This is possible because of the excellent acoustic impedance mismatch between the EAP layer and semiconductor substrate layer.

Figure 3:
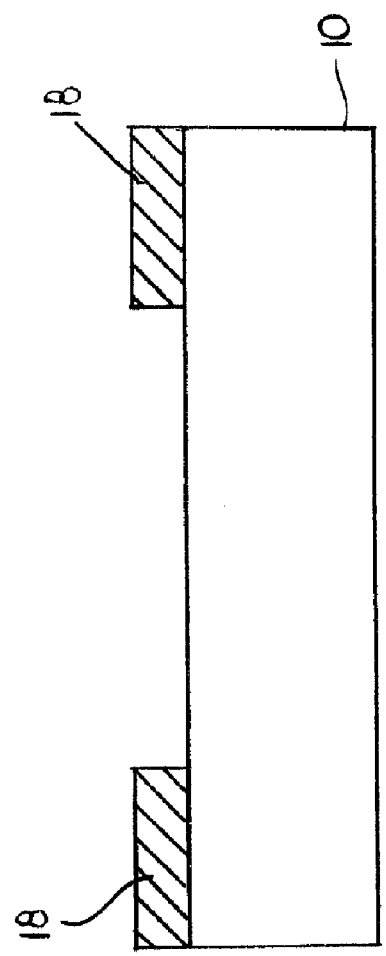
FIG. 3 is a schematic view of a step of making a polymer bulk acoustic resonator according to the present invention.
Figure 4:
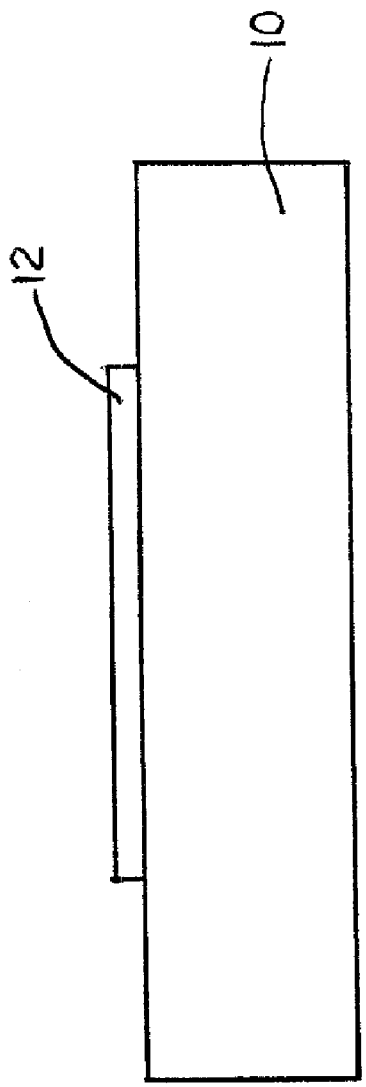
FIG. 4 is a schematic view of a step of making a polymer bulk acoustic resonator according to the present invention.
Figure 5:
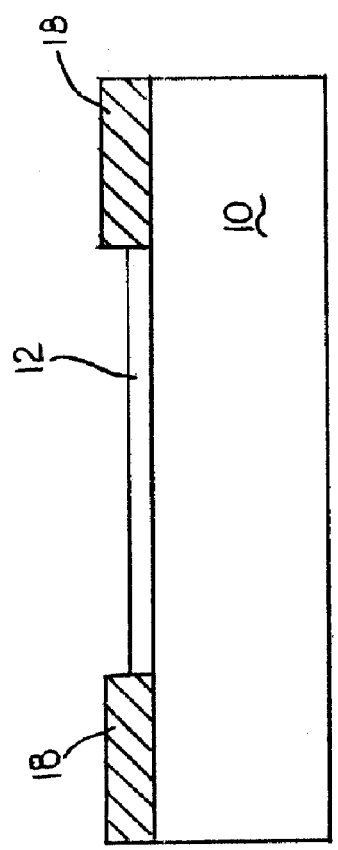
FIG. 5 is a schematic view of a step of making a polymer bulk acoustic resonator according to the present invention.
Figure 6:
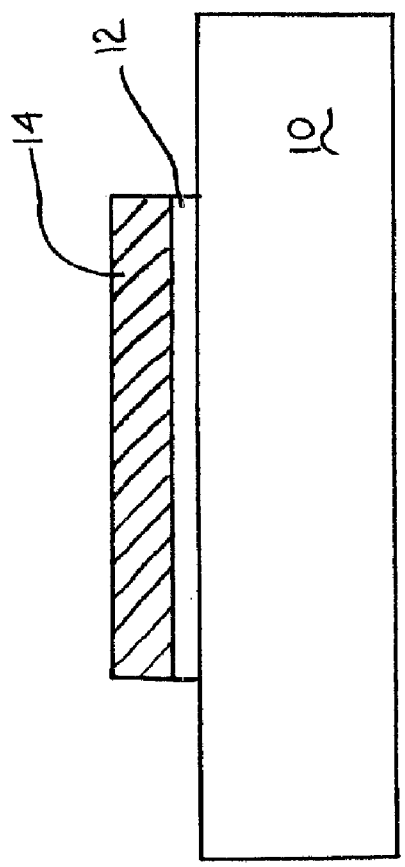
FIG. 6 is a schematic view of a step of making a polymer bulk acoustic resonator according to the present invention.
Figure 7:
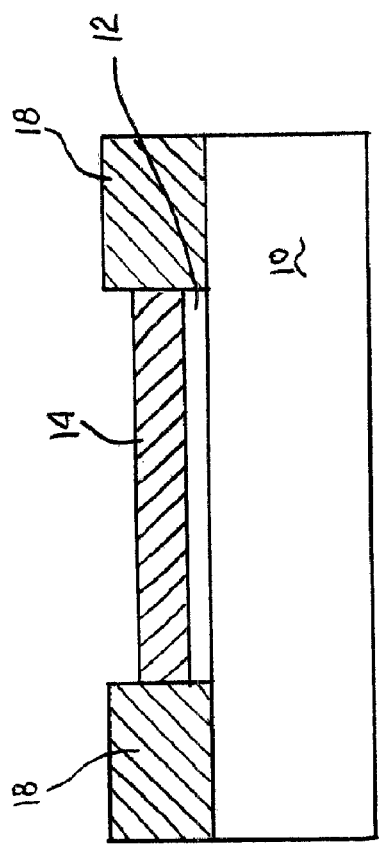
FIG. 7 is a schematic view of a step of making a polymer bulk acoustic resonator according to the present invention.
Figure 8:
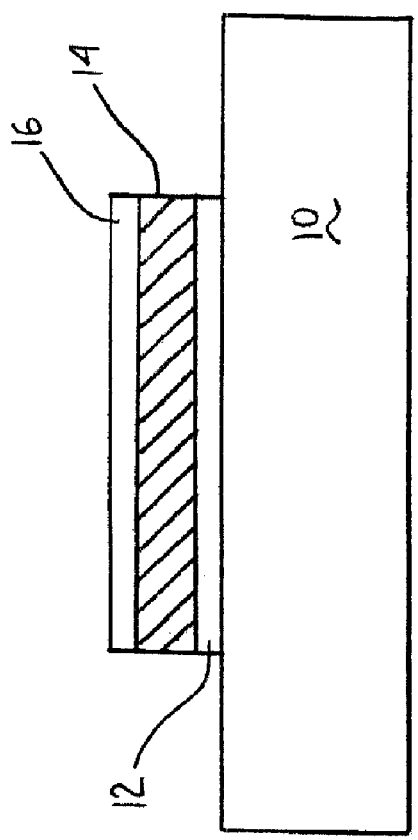
FIG. 8 is a schematic view of a step of making a polymer bulk acoustic resonator according to the present invention.

FIG. 3 shows a schematic diagram of masking the semiconductor substrate layer 10 for photolithograph and organic cleaning. FIG. 4 shows a schematic diagram of the bottom electrode layer 12 being laid down upon the semiconductor substrate layer 10. FIG. 5 shows a schematic diagram of masking the semiconductor substrate layer 10 again in preparation for cleaning and adding the EAP layer 14. FIG. 6 shows a schematic diagram of the EAP layer 14 being laid down on the bottom electrode layer 12. FIG. 7 shows a schematic diagram of masking the semiconductor substrate layer 10 again for cleaning and adding the top electrode layer 16. FIG. 8 shows a schematic diagram of the top electrode layer 16 being laid down on top of the EAP layer 14.

While different embodiments of the invention have been described in detail herein, it will be appreciated by those skilled in the art that various modifications and alternatives to the embodiments could be developed in light of the overall teachings of the disclosure. Accordingly, the particular arrangements are illustrative only and are not limiting as to the scope of the invention that is to be given the full breadth of any and all equivalents thereof.

What is claimed is:

1. A polymer bulk acoustic resonator comprising:
    an active semiconductor layer;
    a first thin film electrode layer applied to said semiconductor layer;
    a thin film electro-active polymer layer applied to said first thin film electrode layer; and
    a second thin film electrode layer applied to said thin film electro-active polymer layer.

2. The polymer bulk acoustic resonator of claim 1, wherein acoustic impedance of said electro-active polymer layer is not similar to acoustic impedance of said semiconductor layer.

3. The polymer bulk acoustic resonator of claim 1, wherein said semiconductor layer includes at least one switch and said electro-active polymer layer is a frequency signal filter.

4. The polymer bulk acoustic resonator of claim 1, wherein said semiconductor layer includes at least one amplifier and said electro-active polymer layer is a frequency signal filter.

5. The polymer bulk acoustic resonator of claim 1, wherein said semiconductor layer includes at least one signal processor and said electro-active polymer layer is a frequency signal filter.

6. A filter switch bank module comprising:
    an active semiconductor layer with switching capability;
    a first thin film electrode layer applied to said semiconductor layer;
    a thin film electro-active polymer layer applied to said first thin film electrode layer with frequency signal filtering capability; and
    a second thin film electrode layer applied to said thin film electro-active polymer layer.

7. The filter switch bank module of claim 6, wherein said active semiconductor layer also includes at least one amplifier integrated as part of said active semiconductor layer.

\* \* \* \* \*